United States Patent [19]

Hyodo

[11] Patent Number: 5,787,269
[45] Date of Patent: Jul. 28, 1998

[54] PROCESS SIMULATION APPARATUS AND METHOD FOR SELECTING AN OPTIMUM SIMULATION MODEL FOR A SEMICONDUCTOR MANUFACTURING PROCESS

[75] Inventor: Toshihiro Hyodo, Ikeda, Japan

[73] Assignee: Ricoh Company, Ltd., Tokyo, Japan

[21] Appl. No.: 531,231

[22] Filed: Sep. 19, 1995

[30] Foreign Application Priority Data

Sep. 20, 1994 [JP] Japan ................................. 6-250190
Dec. 2, 1994 [JP] Japan ................................. 6-323969

[51] Int. Cl.$^6$ ............................................. G06F 11/30
[52] U.S. Cl. ..................... 395/500; 364/578; 364/468.09
[58] Field of Search ........................ 395/500; 364/578, 364/468, 149, 488, 489, 490, 491, 468.09

[56] References Cited

U.S. PATENT DOCUMENTS 4,796,194  1/1989  Atheron ................................. 364/468
5,416,729  5/1995  Leon et al. ............................ 364/578
5,422,317  6/1995  Hua et al. ............................. 437/250
5,486,995  1/1996  Krist et al. ............................ 364/149
5,495,417  2/1996  Fuduka et al. ........................ 364/468
5,504,016  4/1996  Aronowitz ............................ 437/8

Primary Examiner—Kevin J. Teska
Assistant Examiner—Matthew Clay Loppnow
Attorney, Agent, or Firm—Cooper & Dunham LLP

[57] ABSTRACT

A process simulation apparatus simulates a manufacturing process of a semiconductor device which manufacturing process comprising various processes including an ion implantation process and a diffusion process. Process sequence data which represents conditions of a two-dimensional simulation for each process is input to a memory unit. The memory unit stores the process sequence data and also stores condition information for various simulation models usable for each process. An optimum simulation model for each process is selected for performing a two-dimensional simulation for each process. The semiconductor device manufacturing process is simulated by a two-dimensional simulation method using the selected optimum simulation model.

16 Claims, 8 Drawing Sheets

FIG. 2

```
IMPLANT BF2 ENERGY=30 DOSE=3E11
DIFFUSION TEMPERATURE=800 TIME=10 DRYO2 PRESS=1.0
IMPLANT As ENERGY=50 DOSE=1E15 TILT=30
DIFFUSION TEMPERATURE=900 TIME=20 NITROGEN
DEPO POLY THICKNESS=0.1
ETCH POLY RIGHT X=0.5
```

B

1

PROCESS SIMULATION APPARATUS AND METHOD FOR SELECTING AN OPTIMUM SIMULATION MODEL FOR A SEMICONDUCTOR MANUFACTURING PROCESS

BACKGROUND OF THE INVENTION

1. Filed of the Invention

The present invention relates to a process simulation apparatus and method for a semiconductor device manufacturing process and, more particularly, to a process simulation apparatus and method for selecting an optimum simulation model from among simulation models available for simulating a semiconductor device manufacturing process.

2. Description of the Related Art

A two-dimensional process simulator is widely used to reduce a time period spent on development of a semiconductor device and to analyze malfunctioning of a semiconductor device. Generally, in a semiconductor device manufacturing field, the two-dimensional process simulator is used for simulating an ion implantation process, an oxidization process, a diffusion process, an epitaxial growth process, a deposition process and an etching process. The two-dimensional process simulator simulates each of such processes based on input data equivalent to manufacturing conditions for each process.

Since semiconductor devices have been miniaturized and new processes have been added, a high accuracy is required for the two-dimensional process simulator. The accuracy of the two-dimensional process simulator is mainly dependent on an accuracy of a simulation model and an interval of a mesh pattern. Accordingly, a simulation model having a high accuracy is used to cope with miniaturization of the semiconductor devices and addition of the new processes so that the two-dimensional process simulator can perform a highly accurate process simulation.

However, when the highly accurate simulation model is used, an inputting operation for data used for a simulation becomes complex. In order to produce process sequence data, which is data for performing the highly accurate simulation within a short time, an operator is required to have a high-level knowledge regarding a simulation technique. Thus, there is a problem in that a user has some difficulties in operating the two-dimensional process simulator.

Additionally, since an optimum simulation model must be selected according to the process sequence data for each process, a high-level knowledge of simulation models is also required.

When the highly accurate simulation model is used, the accuracy of simulation is increased. However, a long time is spent on a simulation process. In order to reduce an entire simulation time, a simple simulation model having a short processing time must be used for processes other than that requiring an accurate simulation. Additionally, if a fine mesh pattern is used for a simulation model, a long time is spent on calculation. If a coarse mesh pattern is used, accuracy of simulation is decreased.

Accordingly, a user must select an optimum simulation model which can provide a short simulation time while a desired accuracy is maintained. Additionally, an appropriate mesh size must be designated to perform an accurate simulation for a process of manufacturing a semiconductor device.

SUMMARY OF THE INVENTION

It is a general object of the present invention to provide an improved and useful process simulation apparatus and method for a process simulator in which process simulation apparatus and method the above-mentioned problems are eliminated.

A more specific object of the present invention is to provide a process simulation apparatus and method for a process simulator used for simulating a semiconductor device manufacturing process in which process simulation apparatus and method an accurate simulation can be performed with a reduced time spent on the simulation.

Another object of the present invention is to provide a process simulation apparatus and method for a process simulator used for simulating a semiconductor device manufacturing process in which process simulation apparatus and method an optimum simulation model is automatically selected from among available models for each process in the semiconductor device manufacturing process.

Another object of the present invention is to provide a process simulation apparatus and method for simulating a semiconductor device manufacturing process in which process simulation apparatus and method an optimum simulation model having an optimum mesh pattern size is selected.

In order to achieve the above-mentioned objects, there is provided according to the present invention a process simulation apparatus for simulating a manufacturing process of a semiconductor device which manufacturing process comprises various processes including an ion implantation process and a diffusion process, the process simulation apparatus comprising:

reading means for inputting process sequence data which represents conditions of a two-dimensional simulation for each process;

a memory unit storing the process sequence data input from the reading means and also storing condition information for various simulation models usable for each process;

model selecting means for selecting an optimum simulation model for each process so as to perform a two-dimensional simulation for each process; and simulation means for simulating the semiconductor device manufacturing process by a two-dimensional simulation method using the optimum simulation model selected by the model selecting means.

The model selecting means may comprise:

first selecting means for selecting a first simulation model for each process from among the various simulation models, the first simulation model being a most accurate simulation model;

second means for selecting a second simulation model from among the various simulation models, a processing time of the second simulation model being shorter than a processing time of the first simulation model; and comparing means for comparing a result of a one-dimensional simulation performed on the first simulation model with a result of a one-dimensional simulation performed on the second simulation model so as to determine a most appropriate simulation model for each process so that a difference between a result of a simulation performed on the first simulation model and a result of a simulation performed on the most appropriate simulation model falls within a predetermined range.

The process simulation apparatus may further comprise mesh pattern producing means for producing a mesh pattern in accordance with a one-dimensional simulation using the most appropriate simulation model, intervals of the mesh pattern being set to appropriate values so as to maintain an accuracy of the simulation.

Additionally, there is provided according to another aspect of the present invention a process simulation method for simulating a manufacturing process of a semiconductor device which manufacturing process comprises various processes including an ion implantation process and a diffusion process, the process simulation method comprising the steps of:

a) inputting process sequence data which represents conditions of a two-dimensional simulation for each process into reading means;

b) storing the process sequence data input from the reading means and also storing condition information for various simulation models usable for each process in a memory unit;

c) selecting an optimum simulation model for each process for performing a two-dimensional simulation for each process; and d) simulating the semiconductor device manufacturing process by a two-dimensional simulation method using the optimum simulation model selected in the step c).

The step c) may comprise the steps of:

c-1) selecting a first simulation model for each process from among the various simulation models, the first simulation model being a most accurate simulation model;

c-2) selecting a second simulation model from among the various simulation models, a processing time of the second simulation model being shorter than a processing time of the first simulation model; and c-3) comparing a result of a one-dimensional simulation performed on the first simulation model with a result of a one-dimensional simulation performed on the second simulation model so as to determine a most appropriate simulation model for each process so that a difference between a result of a simulation performed on the first simulation model and a result of a simulation performed on the most appropriate simulation model falls within a predetermined range.

The process simulation method may further comprise the step of:

e) producing a mesh pattern in accordance with a one-dimensional simulation using the most appropriate simulation model, intervals of the mesh pattern being set to appropriate values so as to maintain an accuracy of the simulation.

According to the present invention, since an optimum simulation model is automatically selected, a person having little knowledge regarding simulation models can perform an accurate two-dimensional simulation. Additionally, the most appropriate simulation model having a shortest processing time is automatically selected from among simulation models having a predetermined accuracy. Further, a mesh pattern of the selected simulation model is automatically set with appropriate intervals.

Other objects, features and advantages of the present invention will become more apparent from the following detailed description when read in conjunction with the accompanying drawings.

BRIEF DESCRIPTION OF THE DRAWINGS

FIG. 2 shows contents of process sequence data shown in FIG. 1;

DETAILED DESCRIPTION OF THE PREFERRED EMBODIMENTS

Figure 1:
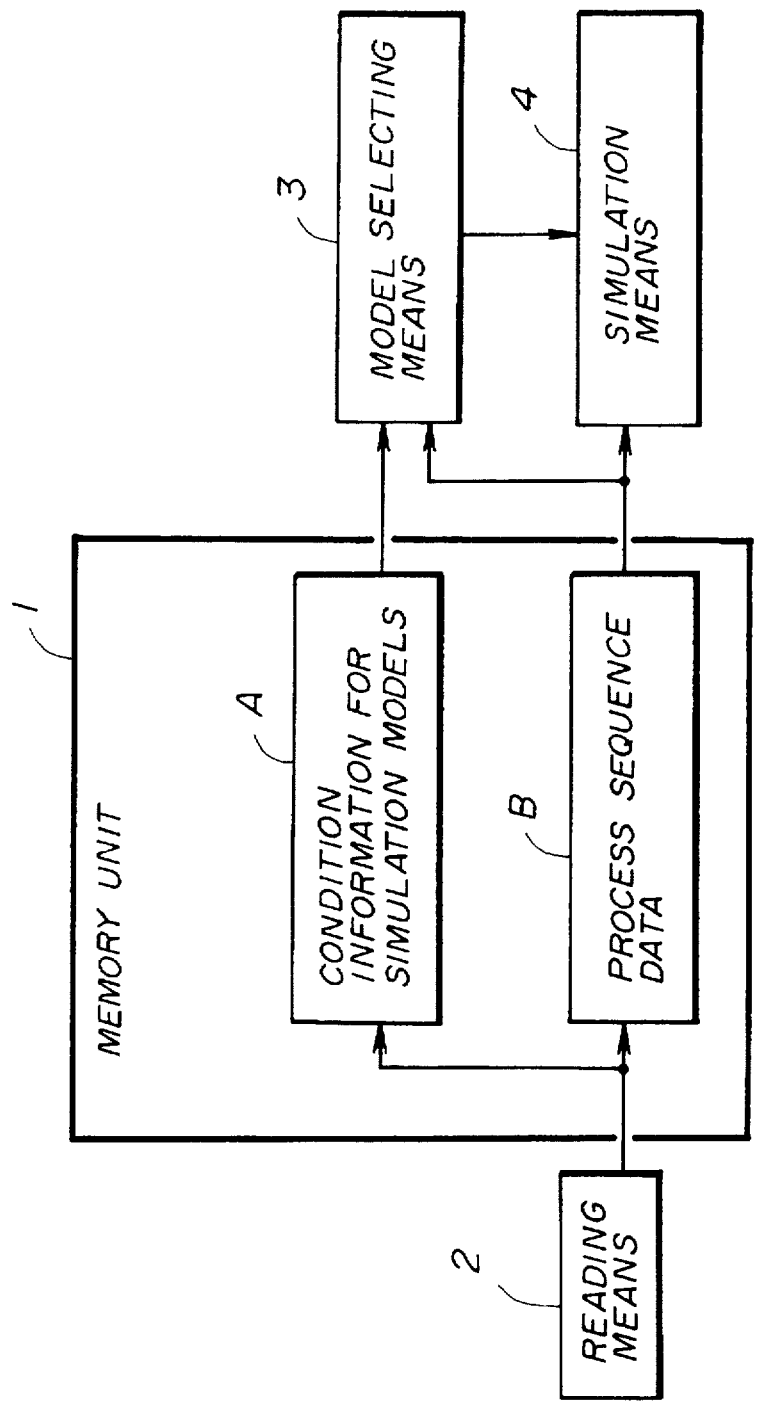
FIG. 1 is a block diagram of a process simulation apparatus according to a first embodiment of the present invention.

A description will now be given, with reference to FIG. 1, of a first embodiment according to the present invention. FIG. 1 is a block diagram of a process simulation apparatus, which is used for a process simulation of a semiconductor device manufacturing process, according to the first embodiment of the present invention.

The process simulation apparatus shown in FIG. 1 comprises a memory unit 1, reading means 2, model selecting means 3 and simulation means 4. The memory unit 1 stores condition information A for various simulation models which can be used for a two-dimensional simulation for each process in the semiconductor device manufacturing process. The condition information A includes a name and feature of each of the simulation models. The simulation models include an LSS model and an MC model as ion implantation simulation models. The simulation models further include a thermal equilibrium (EQ) model, an oxidation enhanced diffusion (OED) model and a point defect (PD) model as diffusion models. The LSS model (named after Lindhard, Scharff, Schiott) and the MC (Monte Carlo) model are well known in the semiconductor device manufacturing process simulation field. The LSS model is an analysis model based on the LSS theory. The calculation time for the LSS model is relatively short. The MC model is a numerical model based on the Monte Carlo method, and is able to handle an oblique ion implantation and estimate point defect density which is necessary for the PD model. The calculation time for the MC model is relatively long. The EQ model, which is a simple model, is based on a thermal equilibrium state. The calculation time for the EQ model is relatively short. The OED model simulates an abnormal diffusion in an oxygen atmosphere. The calculation time for the OED model is relatively long. The PD model simulates an abnormal diffusion due to implantation damage. The calculation time for the PD model is relatively long.

The reading means 2 read process sequence data B supplied by an external device, and inputs the process sequence data B into the memory unit 1. The process sequence data B represents a condition for performing a two-dimensional process simulation for each manufacturing process. The model selecting means 3 sequentially reads the process sequence data B from the memory unit 1 when a two-dimensional simulation command for an ion implantation process or a diffusion process is input. The process sequence data B includes condition information for each process and for performing each process as shown in FIG. 2, for example. In FIG. 2, the terms "IMPLANT" and "DIFFUSION" represent an ion implantation process and a diffusion process, respectively. The terms "ENERGY" and "TEMPERATURE" represent an ion implantation energy and a diffusion temperature, respectively. This information corresponds to information for setting conditions for performing each process. The content of the process sequence data B is determined by a user. The model selecting means 3 compares the process sequence data B with the condition information A, after reading the process sequence data B, so as to select a simulation model which most accurately simulates the actual process. The selection information for the simulation model is set in data which is input to the simulation means 4.

The simulation means 4 performs the two-dimensional simulation by using the selected simulation model, and outputs the simulation result. Accordingly, the process simulation apparatus can perform a simulation for the ion implantation process and the diffusion process by using the most appropriate simulation model.

Figure 3:
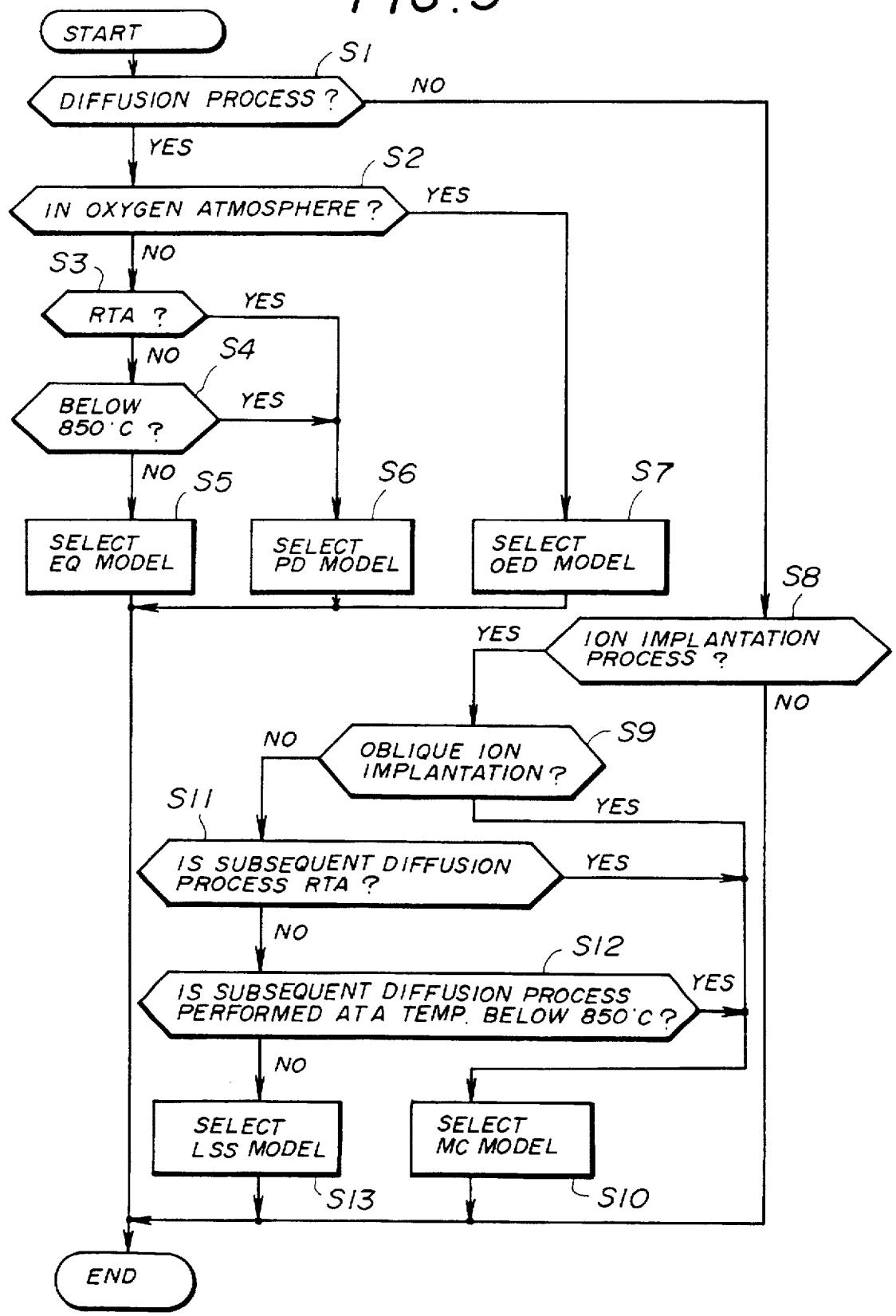
FIG. 3 is a flowchart of an operation for selecting a most accurate simulation model.

A description will now be given, with reference to FIG. 3, of an operation for selecting an appropriate simulation model by comparing the process sequence data B with the condition information A. FIG. 3 is a flowchart of the operation selecting a most accurate simulation model from among available simulation models.

When the operation is started, the model selecting means 3 reads the process sequence data B, which includes information for the process to be simulated, from the memory unit 1. It is then determined, in S1, whether or not the process to be simulated is a diffusion process. If the process to be simulated is a diffusion process, the model selecting means 3 determines, in S2, whether or not the diffusion process is performed in an oxygen atmosphere. If it is determined that the diffusion process is performed in an oxygen atmosphere, the routine proceeds to S7 in which the OED model is selected. The OED model simulates an abnormal diffusion in an oxygen atmosphere.

If it is determined, in S2, that the diffusion process is performed not in an oxygen atmosphere, the routine proceeds to S3. In S3, it is determined whether or not a rapid thermal annealing is performed after an ion implantation. In the rapid thermal annealing (hereinafter referred to as RTA), a heat treatment is performed in a short time at a temperature higher than a regular annealing temperature. If the RTA is performed, the routine proceeds to S6 in which the PD model is selected so as to perform a simulation with a high accuracy. The PD model simulates an abnormal diffusion due to implantation damage. If it is determined, in S3, that the RTA is not performed, the routine proceeds to S4 in which it is determined whether or not the diffusion process is performed at a temperature below 850° C. If the diffusion process is performed at a temperature below 850° C., the routine proceeds to S6 to select the PD model. If the diffusion process is performed at a temperature higher than the temperature of 850° C., the routine proceeds to S5 in which the EQ model, the calculation time of which is short, is selected. This is because if the diffusion process is not the RTA and is not performed at a temperature higher than 850° C., a high accuracy is not needed for the simulation.

On the other hand, if it is determined, in S1, that the process to be simulated is not a diffusion process, the routine proceeds to S8. In S8, it is determined whether or not the process to be simulated is an ion implantation process. If it is determined that the process to be simulated is not an ion implantation process, the routine is ended.

If it is determined, in S8, that the process to be simulated is an ion implantation process, the routine proceeds to S9 in which it is determined whether or not the ion implantation process is an oblique ion plantation process by referring to the process sequence data B. If the oblique ion implantation process is performed, the routine proceeds to S10 in which the MC model is selected. The MC model is necessary for the simulation of the oblique ion implantation process. Since the MC mode must be selected when the simulation model for the diffusion process is the PD model, it is determined, in S11, whether or not the diffusion process performed after the ion implantation process is the RTA. If the RTA is performed as the diffusion process, the routine proceed to S10 to select the MC model. Additionally, it is determined, in S12, whether or not the diffusion process is performed at a temperature below 850° C. If the diffusion process is performed at a temperature below 850° C., the routine proceeds to S10 to select the MC model. If it is determined that the diffusion process is performed at a temperature not below 850° C., the routine proceeds to S13 to select the LSS model the calculation time of which is short.

As mentioned above, the model selecting means 3 automatically selects an accurate simulation model among the simulation models which are available. Accordingly, the user having little knowledge regarding simulation models can perform the two-dimensional simulation with a high accuracy.

Figure 4:
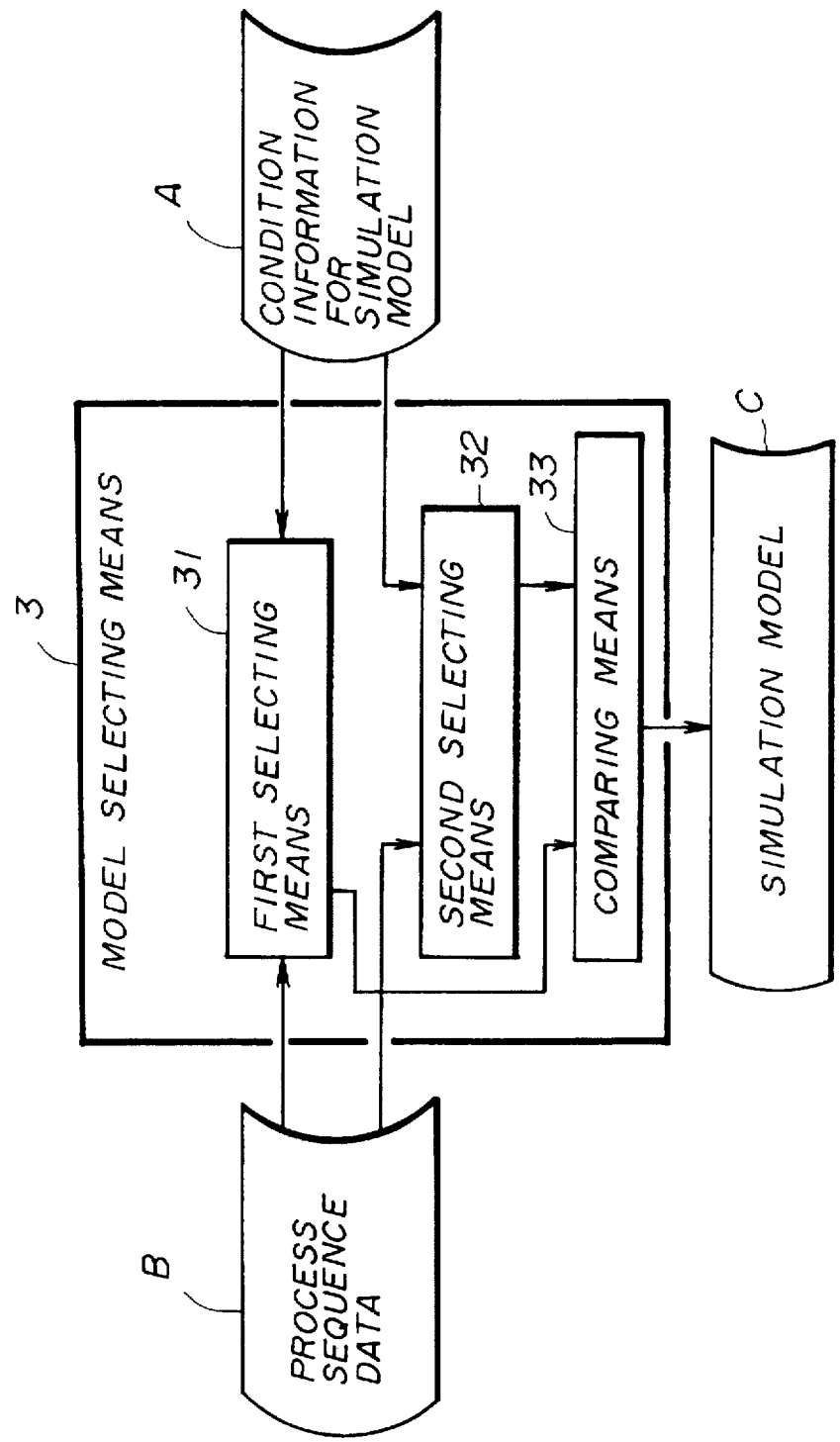
FIG. 4 is a block diagram of a model selecting means of a second embodiment according to the present invention.
Figure 5:
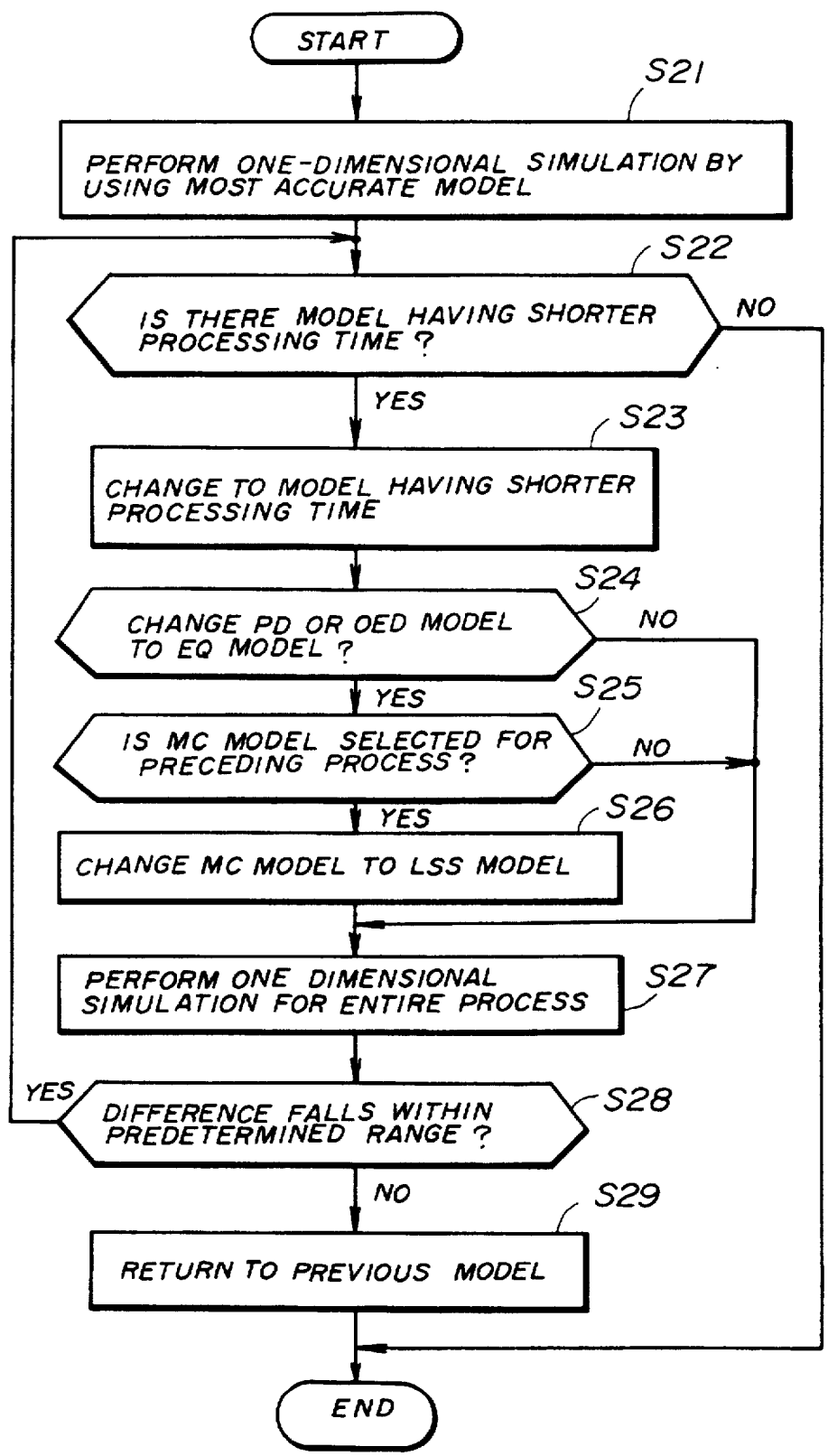
FIG. 5 is a flowchart of an operation performed by the model selecting means shown in FIG. 4.

A description will now be given, with reference to FIGS. 4 and 5, of a second embodiment according to the present invention. FIG. 4 is a block diagram of the model selecting means 3 of the second embodiment. FIG. 5 is a flowchart of an operation performed by the model selecting means 3 of the second embodiment.

As shown in FIG. 4, in this embodiment, the model selecting means 3 comprises first selecting means 31, second selecting means 32 and comparing means 33 which together act to select a simulation model C. The simulation model C is selected based on the most accurate simulation model selected in the same manner as the above-mentioned embodiment so that the difference in the results of simulation between the simulation model C and the most accurate simulation model falls within a predetermined range. The operation shown in FIG. 5 is an example for selecting the simulation model C for a diffusion process.

When the operation shown in FIG. 5 is started, the first selecting means 31 selects the most accurate simulation model for each process in the same manner as the above-mentioned first embodiment. If it is not requested that a simulation be performed by the most accurate simulation model, a one-dimensional simulation is performed, in S21, by using the most accurate simulation model for each process. The result of the simulation is stored as target data. Since the simulation performed in this step is a one-dimensional simulation, a processing time (calculation time) is short even if the most accurate simulation model is used.

The second selecting means 32 of the model selecting means 3 determines, in S22, whether or not there is a simulation model having a shorter processing time than that of the most accurate simulation from among simulation models registered in the condition information A. If it is determined that no simulation model having a shorter processing time is available, the routine is ended without the result of the selection performed by the first selecting means 31. If it is determined that there is a simulation model having a shorter processing time than that of the selected simulation model, the simulation model having the shorter process time is substituted for the selected simulation model in S23. For example, if the PD model or OED model has been selected for a diffusion process, the EQ model is substituted for the PD model or the OED model.

In S24, it is determined whether or not the PD model or the OED model is changed to the EQ model in S23. If the change in S23 is a change from the PD model or the OED model to the EQ model, the routine proceeds to S25 in which it is determined whether or not the simulation model selected for the preceding ion implantation process is the MC model. If the selected model is the MC model, the simulation model for the proceeding ion implantation process is changed, in S26, from the MC model to the LSS model. In this manner, the accuracy of the simulation model of the ion implantation process can be equalized to the accuracy of the subsequent diffusion process.

After the simulation model is changed, a one-dimensional simulation for an entire manufacturing process is performed, in S27, by using the changed simulation model. The comparing means 33 then compares, in S28, the result of the one-dimensional simulation with the previously obtained target data so as to obtain a difference between the result of the one-dimensional simulation and the target data. The difference between the two results is related to, for example, a distribution in density of impurities and a configuration of a semiconductor device. If the difference between the two simulation results falls within a predetermined range, for example, 5%, the routine returns to S22 to repeat S22 to S28 so as to search for a simulation model which gives a shortest processing time with the difference falling within 5%. If the difference between the two simulation results does not fall within the predetermined range, the simulation model which has been changed in S23 is returned to the previous simulation model immediately before the change. This simulation model becomes the simulation model C which is finally selected by the model selecting means. The predetermined range is set to be narrow for the two-dimensional process simulation for a manufacturing process which requires a high accuracy. The predetermined range is set to be wide, on the contrary, for the two-dimensional process simulation for a manufacturing process which does not require a high accuracy.

The operation shown in FIG. 5 is repeated for each process in the semiconductor device manufacturing process so as to select the optimum simulation model for each process in the semiconductor device manufacturing process. Accordingly, the processing time (calculation time) for the simulation for an entire manufacturing process can be reduced while maintaining an appropriate accuracy of the simulation.

In the above-mentioned embodiment, a simulation model having the longest processing time is selected first in S23. However, the simulation model having the shortest processing time may be selected first. In such a case, the simulation model C is finally selected when the difference between the two simulation results first falls within the predetermined range.

Figure 6:
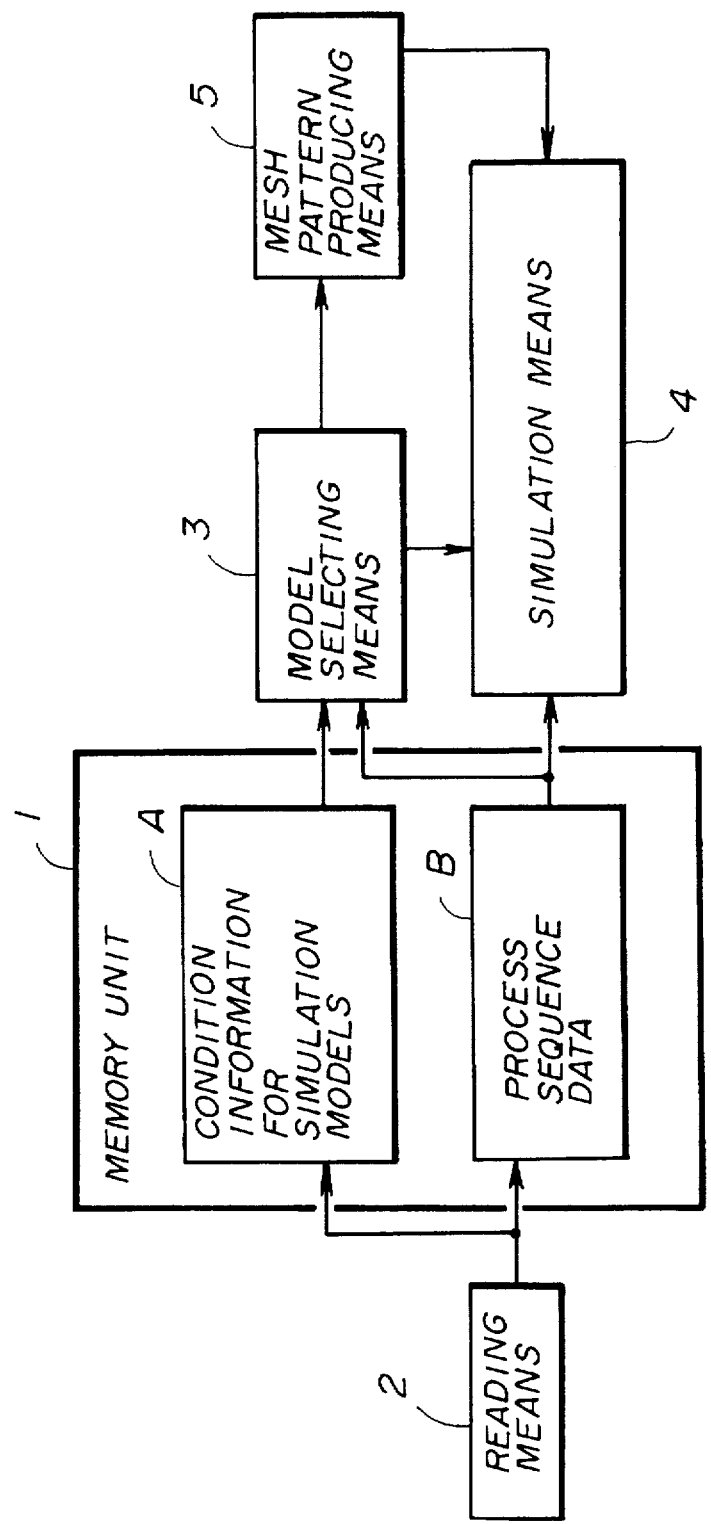
FIG. 6 is a block diagram of a process simulation apparatus according to a third embodiment of the present invention.

A description will now be given, with reference to FIGS. 6, 7 and 8, of a third embodiment according to the present invention. FIG. 6 is a block diagram of a process simulation apparatus according to the third embodiment of the present invention. In FIG. 6, parts that are the same as parts shown in FIG. 1 are given the same reference numerals, and descriptions thereof will be omitted. The third embodiment has the same construction as the first embodiment, and further comprises a mesh pattern producing means 5. The mesh pattern producing means 5 produces a mesh pattern applied to the simulation model C which is finally selected by the model selecting means 3.

Figure 7:
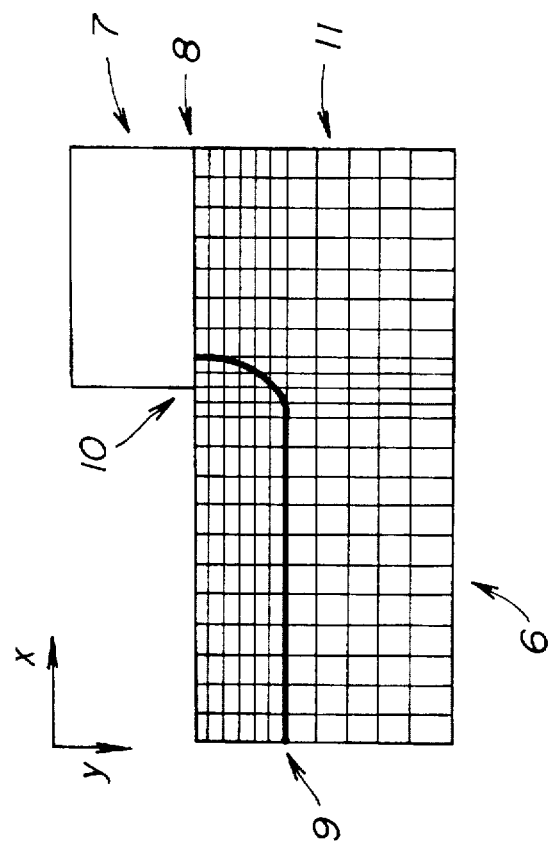
FIG. 7 is an illustration for explaining a mesh pattern used for a simulation model.
Figure 8:
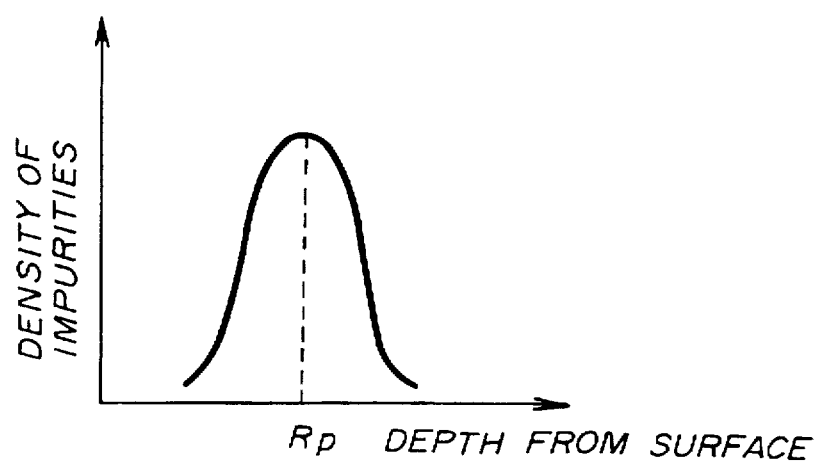
FIG. 8 is a graph showing a relationship between density of impurities and a depth from a surface.

When the model selecting means 3 selects a simulation model, the mesh pattern producing means 5 produces a mesh pattern applied to the selected simulation model as shown in FIG. 7. In FIG. 7, a portion of a surface of a substrate 11 is masked by a mask 7. Information regarding the mask 7 is included in the process sequence data B. Information for the basic mesh pattern is also included in the process sequence data B. When a simulation for an ion implantation process is performed for a MOSFET 6 to which the mask 7 is applied as shown in FIG. 7, the mesh pattern producing means 5 produces a mesh pattern so that intervals of a portion of the mesh pattern in the X direction, which portion is adjacent to an edge 10 of the mask 7, are reduced to less than a standard deviation $dR_p$ of a distribution of implanted ions in the X direction. As for intervals for a mesh pattern in the Y direction, the intervals of the mesh pattern near a surface of the substrate 11 and near a conjunction 9 of impurities are reduced to less than a standard deviation $dR_p$ of a distribution of implanted ions in the Y direction. A position (depth) of the conjunction 9 is determined according to the result of the one-dimensional simulation performed by the model selecting means 3.

A description will now be given of the standard deviation $dR_p$ in the Y direction, for example. Each ion injected into the substrate in an ion implantation process zigzags through the substrate and finally stops at a distance (depth) from the surface of the substrate 11. The distance each ion moves is dependent on collisions with atoms forming a lattice in the substrate 11. Since a large number of ions are injected, distribution of the distances of the ions follow the Gaussian distribution as shown in FIG. 8. Accordingly, the mean value of the distance $R_p$ is a peak value of the distribution of the ions. And the standard deviation $dR_p$ is calculated based on the distribution function.

Accordingly, if the intervals of the mesh pattern are set to be less than the standard deviation $dR_p$, an accurate simulation can be achieved for the portions described above such as a portion near the conjunction 9.

The simulating means 4 performs a two-dimensional simulation based on the simulation model selected by the model selecting means 3 and the mesh pattern produced by the mesh pattern producing means 5. Accordingly, the simulation is performed with an optimum mesh pattern which results in an accurate simulation.

Although, in the above-mentioned third embodiment, the mesh pattern is produced according to the result of the one-dimensional simulation performed by the model selecting means 3, the mesh pattern may be produced by using only the process sequence data B.

The present invention is not limited to the specifically disclosed embodiments, and variations and modifications may be made without departing from the scope of the present invention.

What is claimed is:

1. A process simulation apparatus for simulating a manufacturing process of a semiconductor device which manufacturing process comprises various processes including an ion implantation process and a diffusion process, said process simulation apparatus comprising:

reading means for inputting process sequence data which represents conditions of a two-dimensional simulation for each process;

a memory unit storing said process sequence data input from said reading means and also storing condition information for various simulation models usable for each process;

model selecting means for selecting an optimum simulation model used for simulating each process so as to perform a two-dimensional simulation simulating each process, said model selecting means comparing said process sequence data and said condition information and selecting a simulation model which most accurately simulates an actual process based on the comparison; and simulation means for simulating said semiconductor device manufacturing process by a two-dimensional simulation method using said optimum simulation model selected by the model selecting means to produce simulated results of said device manufacturing process.

2. The process simulation apparatus as claimed in claim 1, wherein said condition information includes conditions of temperature, process time and atmosphere for said diffusion process.

3. The process simulation apparatus as claimed in claim 1, wherein said condition information includes conditions of a direction of ion implantation for the ion implantation process.

4. The process simulation apparatus as claimed in claim 1, wherein said model selecting means comprises:

first selecting means for selecting a first simulation model for each process from among the various simulation models, said first simulation model being a most accurate simulation model;

second means for selecting a second simulation model from among the various simulation models, a processing time of said second simulation model being shorter than a processing time of said first simulation model; and comparing means for comparing a result of a one-dimensional simulation performed on said first simulation model with a result of a one-dimensional simulation performed on said second simulation model so as to determine a most appropriate simulation model for each process so that a difference between a result of a simulation performed on said first simulation model and a result of a simulation performed on said most appropriate simulation model falls within a predetermined range.

5. The process simulation apparatus as claimed in claim 4, wherein said second selecting means repeatedly selects said second simulation model from among the simulation models so that a processing time of said most appropriate simulation model becomes the shortest.

6. The process simulation apparatus as claimed in claim 4, wherein said difference is related to distribution of density of impurities in the semiconductor device.

7. The process simulation apparatus as claimed in claim 4, wherein said difference is related to a configuration of the semiconductor device.

8. The process simulation apparatus as claimed in claim 4, further comprising mesh pattern producing means for producing a mesh pattern in accordance with a one-dimensional simulation using said most appropriate simulation model, intervals of the mesh pattern being set to appropriate values so as to maintain an accuracy of the simulation.

9. A process simulation method for simulating a manufacturing process of a semiconductor device which manufacturing process comprises various processes including an ion implantation process and a diffusion process, said process simulation method comprising the steps of:

inputting process sequence data which represents conditions of a two-dimensional simulation for each process into reading means;

storing said process sequence data input from said reading means and also storing condition information for various simulation models usable for each process in a memory unit;

comparing said process sequence data and said condition information;

selecting an optimum simulation model used for simulating each process for performing a two-dimensional simulation for simulating each process, said selecting step selecting a simulation model which most accurately simulates an actual process, based on the result of said comparison; and simulating said semiconductor device manufacturing process by a two-dimensional simulation method using said optimum simulation model selected in the step c) to produce simulated results of said device manufacturing process.

10. The process simulation method as claimed in claim 9, wherein said condition information includes conditions of temperature, process time and atmosphere for said diffusion process.

11. The process simulation method as claimed in claim 9, wherein said condition information includes conditions of a direction of ion implantation for the ion implantation process.

12. The process simulation method as claimed in claim 9, wherein the step c) comprises the steps of:

c-1) selecting a first simulation model for each process from among the various simulation models, said first simulation model being a most accurate simulation model;

c-2) selecting a second simulation model from among the various simulation models, a processing time of said second simulation model being shorter than a processing time of said first simulation model; and c-3) comparing a result of a one-dimensional simulation performed on said first simulation model with a result of a one-dimensional simulation performed on said second simulation model so as to determine a most appropriate simulation model for each process so that a difference between a result of a simulation performed on said first simulation model and a result of a simulation performed on said most appropriate simulation model falls within a predetermined range.

13. The process simulation method as claimed in claim 12, wherein the steps c-2) and c-3) are repeated so that a processing time of said most appropriate simulation model becomes the shortest.

14. The process simulation method as claimed in claim 12, wherein said difference is related to a distribution of density of impurities in the semiconductor device.

15. The process simulation method as claimed in claim 12, wherein said difference is related to a configuration of the semiconductor device.

16. The process simulation method as claimed in claim 12, further comprising the step of:

producing a mesh pattern in accordance with a one-dimensional simulation using said most appropriate simulation model, intervals of the mesh pattern being set to appropriate values so as to maintain an accuracy of the simulation.

* * * * *